United States Patent [19]

Tanabe et al.

[11] 4,319,397
[45] Mar. 16, 1982

[54] METHOD OF PRODUCING SEMICONDUCTOR DISPLACEMENT TRANSDUCER

[75] Inventors: Masanori Tanabe; Satoshi Shimada, both of Hitachi; Akio Yasukawa, Ibaraki; Hideyuki Nemoto; Motohisa Nishihara, both of Katsuta; Masatoshi Tsuchiya; Ko Soeno, both of Hitachi, all of Japan

[73] Assignee: Hitachi, Ltd., Tokyo, Japan

[21] Appl. No.: 165,985

[22] Filed: Jul. 7, 1980

[30] Foreign Application Priority Data

Jul. 10, 1979 [JP] Japan ................ 54-87234

[51] Int. Cl.³ .................................... H01L 21/58
[52] U.S. Cl. ........................ 29/589; 29/590; 29/610 SG; 338/2
[58] Field of Search .......... 29/589, 590, 595, 610 SG; 357/26; 338/2

[56] References Cited

U.S. PATENT DOCUMENTS

| | | | |
|---|---|---|---|
| 3,197,335 | 7/1965 | Leszynski | 338/2 |
| 3,451,030 | 6/1969 | Garfinkel | 29/610 SG |
| 4,151,502 | 4/1979 | Kurihara et al. | 338/2 |
| 4,176,443 | 12/1979 | Jannuzzi et al. | 29/589 |

*Primary Examiner*—Donald L. Walton
*Attorney, Agent, or Firm*—Craig and Antonelli

[57] ABSTRACT

A strain gauge is formed on one main surface of a semiconductor single crystal substrate while an insulating oxide film is formed on the other main surface of the substrate. A metal junction layer including several layers inclusive of eutectic alloy layers is formed on the surface of the insulating oxide film and the thus prepared structure is mounted on a metal strain generator. By heating this assembly to temperatures approximating to the eutectic point of the eutectic alloy layer, the semiconductor substrate and the metal strain generator are joined together.

17 Claims, 6 Drawing Figures

METHOD OF PRODUCING SEMICONDUCTOR DISPLACEMENT TRANSDUCER

BACKGROUND OF THE INVENTION

This invention relates to a method of producing a semiconductor displacement transducer in which a semiconductor strain detector is bonded to a metal strain generator by means of a metal junction layer.

The semiconductor displacement transducer usually utilizes the mechano-electrical conversion effect in a semiconductor which is usually the piezo-resistance effect in principle. It is a well-known fact that a semiconductor strain detector using the piezo-resistance effect has an output sensitivity several tens of times higher than that of the conventional strain detector using a metal strain gauge.

In this type of semiconductor strain detectors, a strain-sensitive region is formed by diffusing an impurity into a portion of the main surface of a semiconductor single crystal substrate. Since the semiconductor single crystal substrate is an excellent elastic strain generator, the substrate itself is often used as an elastic strain generator in the structure of a semiconductor displacement transducer. However, this constitution is limited only to the case where strain to be generated is relatively small since the semiconductor single crystal substrate is brittle. Accordingly, in order to realize a semiconductor displacement transducer serviceable in relatively large strain conditions, a semiconductor strain detector must be bonded in metal junction to a metal strain generator by means of an insulating oxide film, as disclosed in, for example, U.S. Pat. No. 4,151,502, issued to Y. Kurihara et al on Apr. 24, 1979, entitled "Semiconductor Transducer".

Such semiconductor displacement transducers are usually used in a wide range of temperatures, i.e. from −40° C. to 120° C., and therefore the metal junction layer undergoes creep due to repeated generation of strain especially at high temperatures. As a result, a zero point drift occurred in the output so that a stable characteristic cannot be obtained.

SUMMARY OF THE INVENTION

An object of this invention is to provide a semiconductor displacement transducer which suffers little from zero point drift even at high temperatures and therefore has a stable characteristic.

According to one feature of this invention, strain gauges are formed on one main surface of a semiconductor single crystal substrate while an insulating oxide film is formed on the other main surface of the substrate; first and second metal layers and a eutectic alloy layer are formed in this order on the insulating oxide film; the thus prepared substrate is mounted on a metal strain generator; and this assembly is heated for bonding to a temperature approximating to the eutectic point of the eutectic alloy.

DESCRIPTION OF THE PREFERRED EMBODIMENTS

Figure 1:
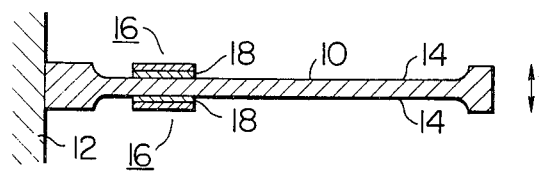
FIG. 1 shows in cross section a semiconductor displacement transducer according to this invention.

In FIG. 1, one end of a metal strain generator 10, made of a Fe-Ni or a Fe-Ni-Co alloy, is rigidly attached to a stationary member 12. Semiconductor strain detectors 16 are attached via metal junction layers 18 onto the upper and lower surfaces 14 of the metal strain generator 10, near the stationary member 12. Accordingly, if external force is applied to the remaining free end of the metal strain generator 10 as indicated by the double-headed arrow in FIG. 1, the metal strain generator 10 undergoes displacements so that strains having the same magnitude but the opposite signs are induced in the semiconductor strain detectors 16.

Figure 2:
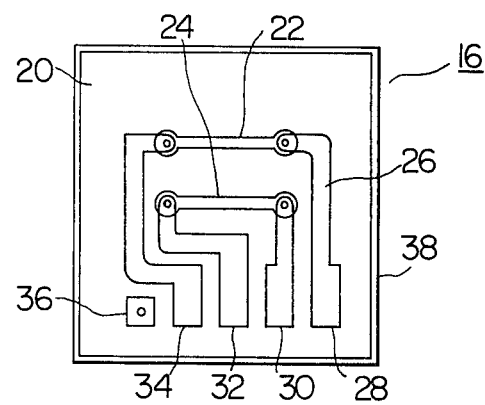
FIG. 2 shows in plan a semiconductor strain detector.

FIG. 2 shows in plan a semiconductor strain detector. The structure of the semiconductor strain detector 16 is as follows. P-type semiconductor strain gauges 22 and 24 are formed in one of the main surfaces of an N-type silicon single crystal substrate 20, through the diffusion of an impurity such as, for example, boron. Also, on the main surface of the substrate 20 are formed gauge pads 28, 30, 32 and 34 used for connecting the electrodes 26 of the gauges 22 and 24 with leads for conducting electric signals to external circuits. Further, a substrate pad 36 is formed to keep the substrate 20 at a high electric potential for the purpose of improving the signal-to-noise ratio attributable to external electric noise. An insulating oxide film 38 of $SiO_2$ is so formed as to cover the side surfaces and the other main surface of the semiconductor substrate 20, in order to insulate the semiconductor strain detector 16 from the metal strain generator 10.

Figure 3:
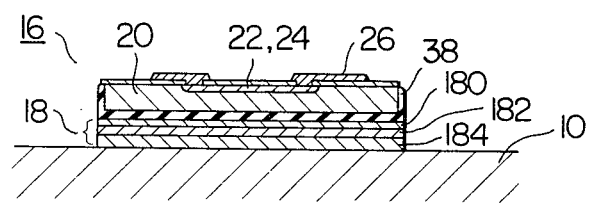
FIG. 3 shows in cross section a principal portion of the transducer shown in FIG. 1.

FIG. 3 shows the semiconductor strain detector 16 as joined to the metal strain generator 10 by means of a metal junction layer 18, which includes a binder layer 180, a stopper layer 182 and a eutectic alloy solder layer 184. As the binder layer 180 is used such metal as Cr that can be firmly bonded to the insulating oxide film 38 and can easily form intermetallic compound with the eutectic alloy solder layer 184 for alloy junction. As the stopper layer 182 is used such metal as Cu or Ni that can suppress the reaction of the binder layer 180 with the eutectic alloy solder layer 184. A eutectic alloy such as of Au-Ge or Au-Si system is used as the eutectic alloy solder layer 184.

Figure 4:
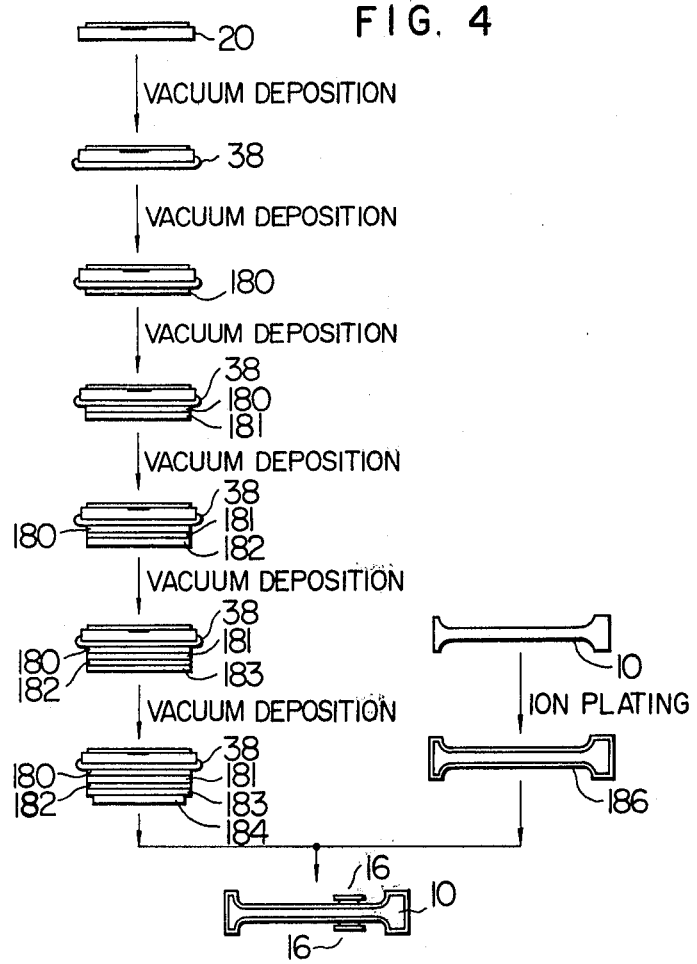
FIG. 4 shows the steps of a procedure for joining metal junction layers together.

FIG. 4 shows the steps of a process for forming the above-mentioned metal junction layer. An oxide film 38 is formed on the surface of a silicon substrate 20 and chromium is vacuum-deposited, as a binder layer 180, on the surface of the oxide film 38. A Cr-Cu alloy layer 181 is formed on the Cr layer 180 through vacuum deposition and then a Cu layer to serve as a stopper layer 182 is vacuum-deposited on the Cr-Cu layer 181, which serves to improve adhesion between the layers 180 and 182. A Au layer 183 is vacuum-deposited on the stopper layer 182 and finally a Au-Ge eutectic alloy layer to serve as a eutectic alloy solder layer 184 is vacuum-deposited on the Au layer 183, which serves to improve adhesion between the layers 182 and 184. On the other hand, the surface of a metal strain generator 10 is plated with gold layer 186 by ion-plating method and the semiconductor strain detector 16 is mounted on the metal strain generator 10 in such a manner that the eutectic alloy solder layer 184 is in contact with the metal strain generator 10 (in this case, two detectors 16 are placed on both the surfaces of the generator 10). And this assembled condition is maintained by means of jigs.

Figure 5:
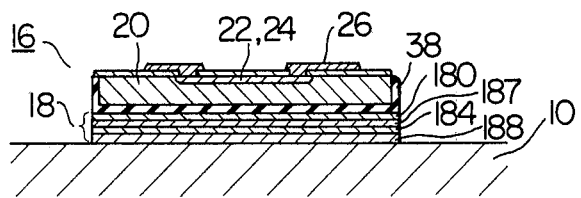
FIG. 5 shows in cross section the principal portion of the transducer shown in FIG. 3 as a result of the step of heating.

Next, this assembly held by the jigs is heated to a temperature nearly equal to the eutectic point (about 400° C.) of the Au-Ge eutectic alloy. The Au layer 186 serves to ensure bonding of the detectors 16 to the generator 10. In this treatment, as shown in FIG. 5, the binder layer 180 and the eutectic alloy solder layer 184 form a first intermetallic compound 187, i.e. Cr-Ge system, and at the same time the constituent element Ni of the metal strain generator 10 (Fe-Ni or Fe-Ni-Co alloy) diffuses in solid phase into the eutectic alloy solder layer 184 to form a second intermetallic compound (Ni-Ge system) 188. As a result, the thickness of the eutectic solder layer 184 is reduced to 1.5 $\mu$m. Moreover, the first and the second intermetallic compounds 187 and 188 are stable substances free from such an undesirable phenomenon as creep and since the Au-Ge eutectic alloy melts at about 400° C., it can firmly join the semiconductor strain detector 16 and the metal strain generator 10 without adversely affecting their desirable properties. The constituent element Cu of the stopper layer 182 diffuses into the eutectic alloy solder layer 184 so that the stopper layer 182 cannot exist as a single, independent layer. Likewise, the layers 181, 183 and 186 are no longer independent ones in macroscopic observation.

Figure 6:
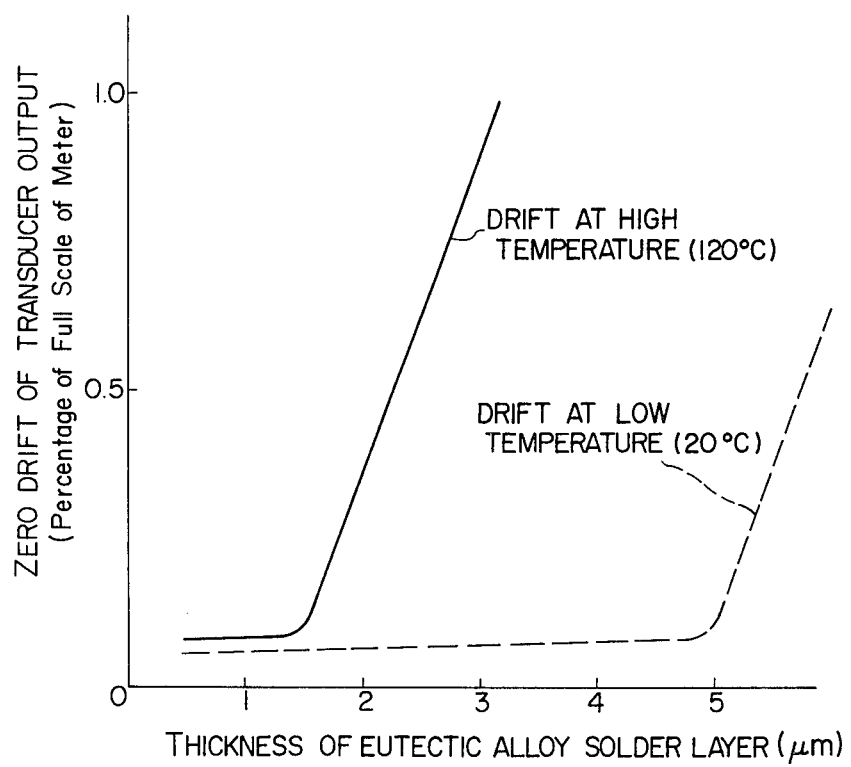
FIG. 6 shows in graphical representation the relationship between the thickness of the eutectic alloy solder layer and the zero point drift of the output.

FIG. 6 shows the relationship between the thickness of the eutectic alloy solder layer and the zero point drift of the output, this relationship being discovered as a result of the present inventor's experiments. In FIG. 6, solid curve indicates the zero point drift at a high temperature (120° C.) and dashed curve indicates the zero point drift at a room temperature (20° C.). According to this invention, the semiconductor strain detector and the metal strain generator are joined together by means of the metal junction layer and the first and the second intermetallic compounds are formed by the heat treatment at a temperature nearly equal to the eutectic point of the eutectic alloy solder layer so that, as apparent also from FIG. 6, the thickness of the eutectic alloy solder layer can be reduced to substantially not greater than 1.5 $\mu$m and that the zero point drift at a high temperature can be reduced to less than 0.1% (with respect to the full scale of an indicating meter).

We claim:

1. A method of producing a semiconductor displacement transducer, comprising:
    forming a strain gauge on one surface of a semiconductor single crystal substrate;
    forming an insulating oxide film on the other surface of said substrate;
    forming a first metal layer on said insulating oxide film;
    forming a second metal layer on said first metal layer;
    forming a eutectic alloy layer on said second metal layer; and
    mounting said substrate thus treated onto a metal strain generator and joining them together by heating this assembly to a temperature approximating the eutectic point of said eutectic alloy to form a compound of said first metal layer and said eutectic alloy layer.

2. A method as claimed in claim 1, wherein said first metal layer is of Cr, said second metal layer is of Cu or Ni, and said eutectic alloy layer is of Au-Ge or Au-Si eutectic alloy.

3. A method as claimed in claim 1, wherein said first and second metal layers and said eutectic alloy layer are formed by vacuum deposition.

4. A method as claimed in claim 1, wherein said strain gauge is formed by diffusing an impurity into said one surface of said substrate.

5. A method as claimed in claim 1, wherein the thickness of said eutectic alloy layer is controlled to be substantially not greater than 1.5 $\mu$m after the heating treatment.

6. A method of producing a semiconductor displacement transducer, comprising:
    forming a P-type strain gauge in one of the main surfaces of an N-type semiconductor single crystal substrate and pads for applying a high electric potential to said substrate therethrough on said one main surface of said substrate;
    forming an insulating oxide film on the other main surface of said substrate;
    forming a metal junction layer on said insulating oxide layer, said metal junction layer including a plurality of metal layers inclusive of eutectic alloy layers; and
    mounting said substrate thus treated onto a metal strain generator and joining them together by heating this assembly to a temperature approximating the eutectic point of said eutectic alloy to form a compound of one of said metal layers and one of said eutectic alloy layers.

7. A method as claimed in claim 6, wherein the component layers of said metal junction layer are a Cr layer, a Cu or Ni layer and a Au-Ge or Au-Si eutectic alloy layer, deposited in this order on said insulating oxide film.

8. A method as claimed in claim 6, wherein said metal junction layer is formed on said oxide layer by vacuum deposition.

9. A method as claimed in claim 6, wherein said strain gauge is formed by diffusing an impurity into the surface of said substrate.

10. A method as claimed in claim 6, wherein the thickness of said eutectic alloy layer is controlled to be substantially not greater than 1.5 $\mu$m after the heating treatment.

11. A method of producing a semiconductor displacement transducer, comprising:
    forming a strain gauge by diffusing an impurity into one main surface of a semiconductor single crystal substrate;
    forming an insulating oxide film on the other main surface of said substrate;
    forming a Cr layer on the surface of said insulating oxide film by vacuum deposition;
    forming a Cr-Cu or Cr-Ni layer on the surface of said Cr layer by vacuum deposition;
    forming a Cu or Ni layer on the surface of said Cu-Cr or Cr-Ni layer by vacuum deposition;
    forming a Au layer on the surface of said Cu or Ni layer by vacuum deposition;
    forming a Au-Ge or Au-Si eutectic alloy layer on the surface of said Au layer by vacuum deposition;
    plating the surface of a metal strain generator with gold by ion plating method; and mounting said substrate thus treated onto said gold-plated metal strain generator and joining them together by heating this assembly to a temperature approximating the eutectic point of said eutectic alloy to form a compound of said Cr layer and said eutectic alloy layer.

12. A method as claimed in claim 2 or 7, wherein said metal strain generator comprises a substrate coated with a gold layer.

13. A method as claimed in claim 1, wherein a third metal layer is formed between the first and second metal layers to improve adhesion between said first and second layers and a fourth metal layer is formed between said second and eutectic alloy layers to improve adhesion between said second and eutectic alloy layers.

14. A method as claimed in claim 1 or 11, wherein said metal strain generator is made of a Ni containing metal, and wherein during said heating, nickel from said metal strain generator forms a compound of said eutectic alloy layer and said nickel.

15. A method as claimed in claim 14, wherein said Ni containing metal is Fe-Ni or Fe-Ni-Co alloy.

16. A method as claimed in claim 6, wherein said metal strain generator is made of a Ni-containing metal, and wherein, during said heating, nickel from said metal strain generator forms a compound of one of said eutectic alloy layers and said nickel.

17. A method as claimed in claim 16, wherein said Ni-containing metal is Fe-Ni or Fe-Ni-Co alloy.

* * * * *